United States Patent [19]
Hirano

[11] Patent Number: 5,381,087
[45] Date of Patent: Jan. 10, 1995

[54] LSI WITH BUILT-IN TEST CIRCUIT AND TESTING METHOD THEREFOR

[75] Inventor: Masashi Hirano, Tokyo, Japan

[73] Assignee: Kabushiki Kaisha Toshiba, Kanagawa, Japan

[21] Appl. No.: 874,889

[22] Filed: Apr. 28, 1992

[30] Foreign Application Priority Data

Apr. 30, 1991 [JP] Japan .................................. 3-098820

[51] Int. Cl.⁶ .......................................... G01R 31/00
[52] U.S. Cl. .................................. 324/158.1; 324/73.1
[58] Field of Search ............... 324/158 R, 158 F, 73.1, 324/158.1, 763; 437/8; 371/22.1, 22.3, 22.6, 15.1, 25.1

[56] References Cited

U.S. PATENT DOCUMENTS

| | | | |
|---|---|---|---|
| 4,752,729 | 6/1988 | Jackson et al. | 324/73.1 |
| 4,894,605 | 1/1990 | Ringleb et al. | 324/158 R |
| 4,912,709 | 3/1990 | Teske et al. | 371/22.1 |
| 5,097,205 | 3/1992 | Toyoda | 324/158 R |
| 5,132,614 | 7/1992 | Sakamoto et al. | 324/73.1 |
| 5,144,230 | 9/1992 | Katoozi et al. | 324/158 R |
| 5,159,263 | 10/1992 | Yaguchi | 324/158 R |
| 5,189,365 | 2/1993 | Ikeda et al. | 324/158 R |

*Primary Examiner*—Vinh Nguyen
*Attorney, Agent, or Firm*—Finnegan, Henderson, Farabow, Garrett & Dunner

[57] ABSTRACT

A high-speed LSI chip to be tested and evaluated by a readily available low-speed semiconductor tester and evaluation equipment. The high-speed LSI includes within the chip a clock supply circuit for supplying a high speed clock and an internal circuit, connected to the clock supply circuit, in which the high-speed clock is supplied from the clock supply circuit. A method for testing and evaluating the LSI chip. The method includes the steps of: supplying a high-speed clock generated from a clock supply circuit which is located within the semiconductor chip; and sending back a result of a semiconductor chip in response to the high-speed clock to the tester/evaluation equipment to be evaluated.

13 Claims, 3 Drawing Sheets

LSI WITH BUILT-IN TEST CIRCUIT AND TESTING METHOD THEREFOR

BACKGROUND OF THE INVENTION

1. Field of the Invention

The present invention relates to an LSI testing method and an LSI that is suitably adopted for the LSI testing method. It particularly relates to a method capable of testing a high-speed and highly functional LSI chip easily, reliably and rapidly.

2. Description of the Prior Art

In the conventional practice, employed an LSI (Large Scale Integration) tester has been employed for functional and DC/AC characteristics testing of an LSI chip and for analyzing a fault of the LSI chips as shown in FIG. 1. The LSI tester produces a clock with a basic operation frequency necessary for testing the LSI chip, inputs an operation result of the LSI to the LSI tester, and then outputs an evaluation result to a CRT (Cathode Ray Tube). An equipment having evaluation means except for the tester is called evaluation equipment hereinafter. There are available various kinds of evaluation equipment depending on what is to be evaluated. A high-grade equipment is especially costly. The high-grade tester/evaluation equipment is, in general, the one that can test an LSI chip with clock speeds of greater than 50 MHz.

In a high temperature test of the LSI chip, the LSI tester or the evaluation equipment is connected to a thermostatic chamber so that a high-speed clock or an input signal such as an operation signal is sent to each LSI chip from the LSI tester or the evaluation equipment, and then an output signal of each LSI chip is inputted back to the LSI tester to be evaluated. This test is better known as a BURN-IN test. In the BURN-IN test, a relatively simple evaluation equipment is used since a costly equipment cannot be practically used in, for example, a mass-production line of 10,000 items of LSI chips.

In the above-mentioned LSI testings, the LSI tester and evaluation equipment are equipped with a predetermined pattern generator and a plurality of signal channels so that the evaluation equipment can supply a clock if the clock alone is desired and it can supply a test pattern if some sort of test pattern is required to enable the LSI chip in an operation condition.

However, in the above conventional LSI test method, the clock generated by the LSI test is supplied to the LSI to be tested and evaluated. Therefore, the clock and the test pattern which are supplied from the tester must be adjusted corresponding to the specific clock and test pattern of the LSI chip to be tested, thus requiring much extra time for completing such adjustment.

Further, especially in the BURN-IN test, a the costly evaluation equipment cannot be practically utilized, and thus, a high-speed clock cannot be supplied to a highly functional LSI chip. Hence, a precise test and evaluation cannot be executed at the high-speed clock. Even if a reliable high-speed and costly LSI tester or evaluation equipment is used, further increases of clock frequency are constantly required to meet an ever fast-growing demand in LSI chip capacity especially in terms of clock speed which is becoming fasted and complicated. Therefore, the currently available relatively costly LSI tester or evaluation equipment will soon be somewhat obsolete in that sense, thus, constantly requiring further improvement to the current functional capability of the tester. This fast raises a grave concern over increases in the test cost in terms of manufacturing costs as a whole.

SUMMARY OF THE INVENTION

The present invention has been made to solve the foregoing drawbacks, and has an object of providing a test method capable of testing different kinds of high-speed and highly functional LSI chip precisely and rapidly using an already available, simply constructed LSI tester or evaluation equipment and capable of testing chips without generating varied clock speeds for each different chip design.

It is another object of the present invention to provide an LSI chip capable of executing a test at high frequency by using the currently available, less costly test equipment without further purchasing a costly test equipment and without requiring test circuitry external to the system, thus minimizing testing cost.

According to an aspect of the present invention an LSI chip is provided comprising a clock supply circuit therein which includes a high-speed block generation circuit for generating a high-speed clock and a selection circuit for selecting an appropriate clock speed to be supplied to an internal circuit; and an internal circuit, connected to the clock supply circuit, in which the high-speed clock is supplied from the clock supply circuit.

According to another aspect of the present invention, a method is provided comprising the steps of: supplying a high-speed clock generated from a clock supply circuit which is located within the semiconductor chip and has a high-speed clock generation circuit for generating a high-speed clock and a selection circuit for selecting an appropriate clock speed to be supplied to an internal circuit; and sending back a result of a semiconductor chip in response to the high-speed clock to the tester/evaluation equipment to be evaluated.

Other features and advantages of the present invention will become apparent from the following description taken in conjunction with the accompanying drawings.

DETAILED DESCRIPTION OF THE PREFERRED EMBODIMENTS

The embodiments of the present invention will be described herein with reference to the accompanying drawings.

Figure 2:
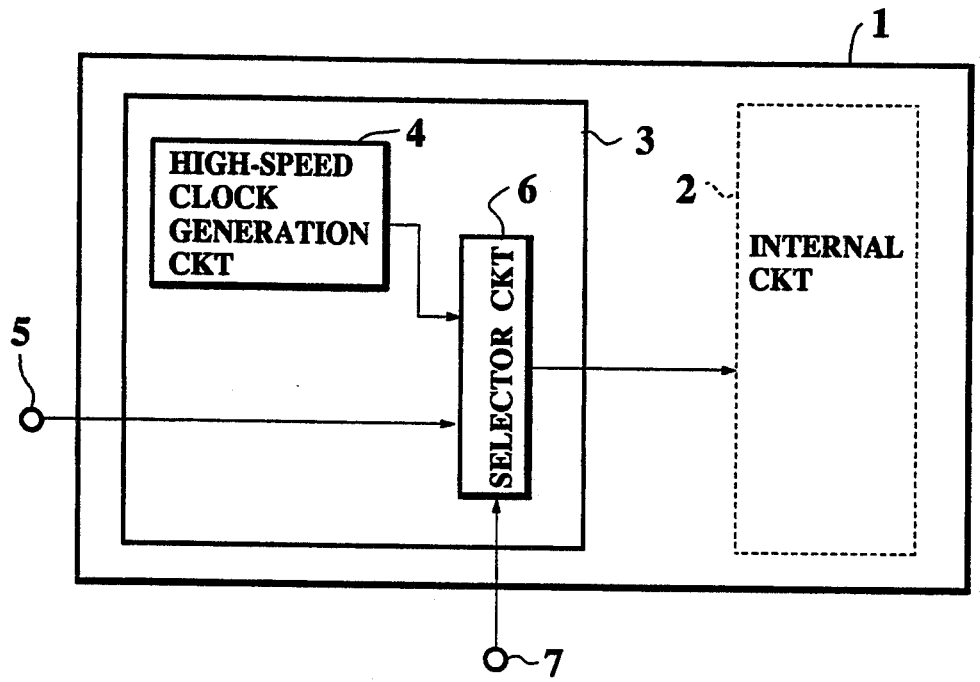
FIG. 2 shows a block diagram of an LSI chip to be tested and evaluated according to the first embodiment of the present invention, where an on-chip clock supply circuit 3 comprising a high-speed clock generation circuit 4 and a selector circuit 6 is built in the LSI chip.

Referring to FIG. 2, an LSI (Large Scale Integration) chip according to the first embodiment of the present invention is explained.

Figure 1:
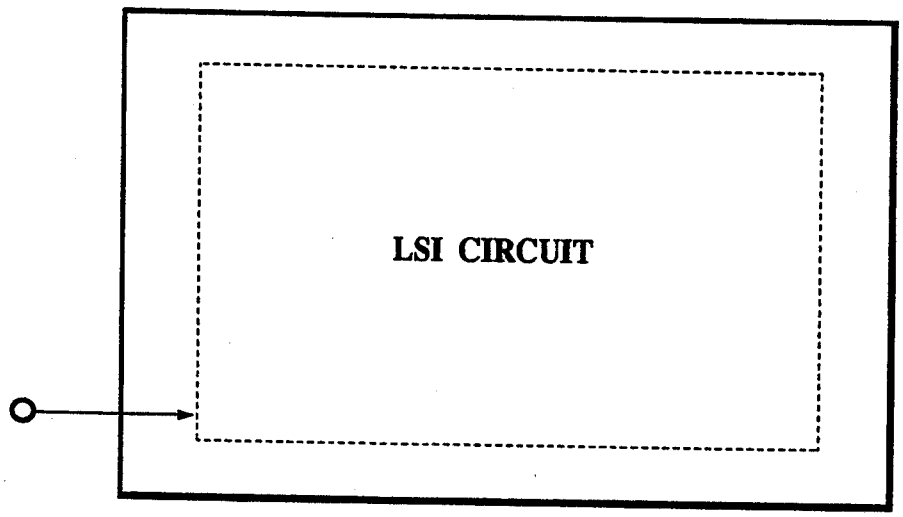
FIG. 1 shows a block diagram of an LSI chip to be tested and evaluated in the conventional practice.
Figure 6:
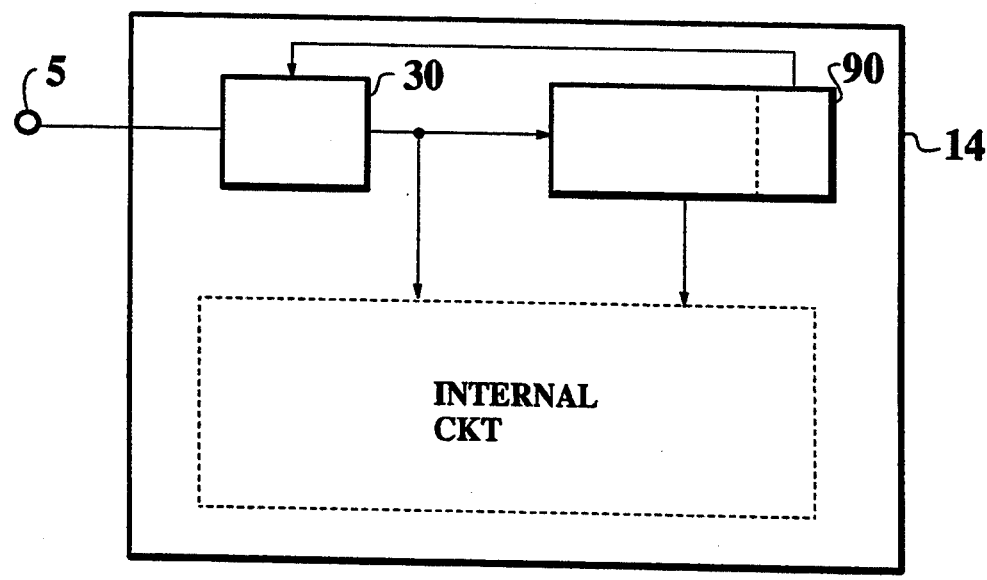
FIG. 6 shows a block diagram of an LSI chip to be tested and evaluated according to the fifth embodiment, where test pattern means 90 stores data in a feedback manner such that a selection signal is automatically outputted therefrom when an operation mode is switched to a test mode.

On an LSI chip 1, a clock supply circuit 3 is provided which supplies a high-speed clock of a basic operation frequency to a high-speed and highly functional internal circuit 2. In the clock supply circuit 3, a high-speed clock generation circuit 4, a clock selector circuit 6, and a clock input terminal 5 which is connected to an LSI tester (not shown) and the clock selector circuit 6 are provided. The clock selection circuit 6 is connected to a clock selection signal input terminal 7 as well. The clock selection signal includes test patterns to be tested on the LSI circuit. A clock selection signal is inputted through the clock selection signal input terminal 7 to the selector circuit 6 where a selected signal is output to the internal circuit 2. Namely, a clock from the outside such as from the LSI tester is selected in a usual case; the clock from the high-speed clock generator circuit 4 is selected at testing. The high-speed clock generation circuit 4 comprises, for example, a ring oscillator, and serves to supply a basic operation clock for testing the internal circuit 2. The clock selection signal is supplied from the outside of the LSI chip. It shall be appreciated that the clock selection signal may be automatically outputted from within the LSI 14 when an operation mode of the LSI is switched to a test mode. For example, the clock selection signal is stored in the test pattern 90 as shown in FIG. 6 of the fifth embodiment according to the present invention.

In a normal case, the input clock through the clock input terminal 5 is selected and is outputted to the inner circuit 2 to activate the LSI 1. When a maximum clock frequency that is generated from the LSI tester or the evaluation equipment (not shown) to activate the LSI 1 is slower than the activation frequency of the LSI 1, the high-speed clock generated at the high-speed clock generation circuit 4 is selected, thus supplying the high-speed clock to the internal circuit 2 to activate the LSI 1. Accordingly, the high-speed clock generation circuit 4 is provided within the LSI chip which makes possible for the LSI to be always operates at the basic operation frequency even if the maximum operation frequency of the LSI tester or evaluation equipment is slower than the basic operation frequency of the LSI 1.

Figure 3:
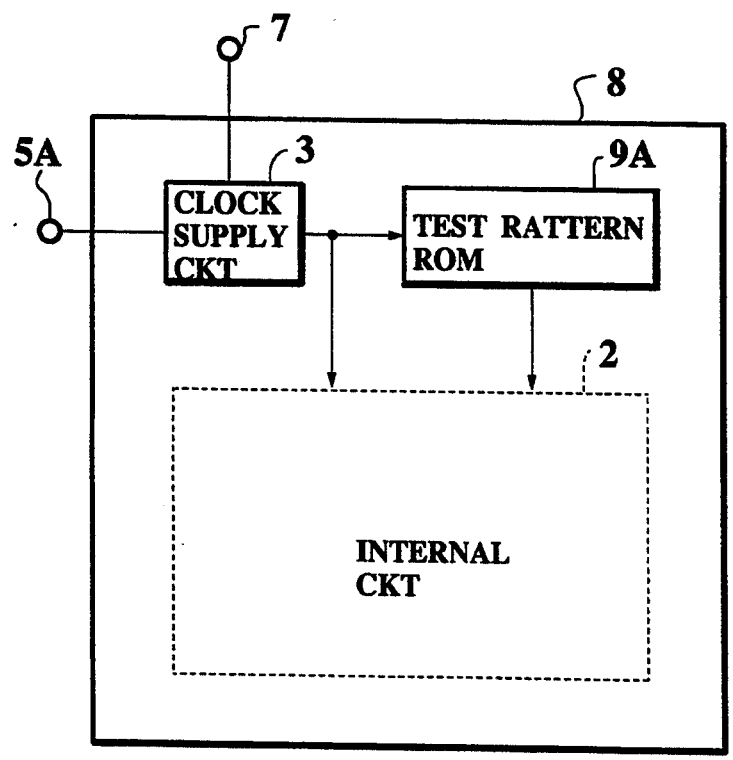
FIG. 3 shows a block diagram of an LSI chip to be tested and evaluated according to the second embodiment of the present invention, where a built-in on-chip test pattern ROM is implemented therein.

On the other hand, there is an LSI chip such as a microprocessor whose circuitry is not actuated by merely inputting the clock alone unless a command or a test pattern is inputted. In that case, a memory 9A as shown in FIG. 3 as the second embodiment, storing the test pattern to activate an LSI 8 is provided in the LSI chip so that the test pattern is executed to activate the circuitry. The memory 9A may be provided exclusively for storing the test pattern. It is to be noted that the test pattern may be stored as a part of the memory if the command storing memory itself is already provided in the LSI chip. As a method to execute the test pattern, a test-exclusive command for executing the test pattern as a part of the entire commands is programmed, then the test-exclusive command is provided externally to the LSI 8 by means of the LSI tester or evaluation equipment. Then, at the time of executing the test pattern, the high-speed clock supplied from the clock supply circuit 3 in FIG. 3 is selected to activate the LSI 8 at the basic operation frequency.

Accordingly, there is no need to set up a specific program within the LSI tester/evaluation equipment to activate the LSI 8, thus simplifying or letting the LSI tester/evaluation equipment remain intact. Furthermore, the LSI tester/evaluation equipment can readily cope with various kinds of LSIs precisely and rapidly. In particular, a steady high-speed clock and a steady operation state can be maintained in the BURN-IN test even when using a less costly LSI tester which is readily available. It is to be noted that the memory 9A for storing the program may be a ROM (Read Only Memory), PROM (Programmable ROM), EPROM (Erasable Programmable ROM), EEPROM (Electrically Erasable Programmable ROM) or the like.

Figure 4:
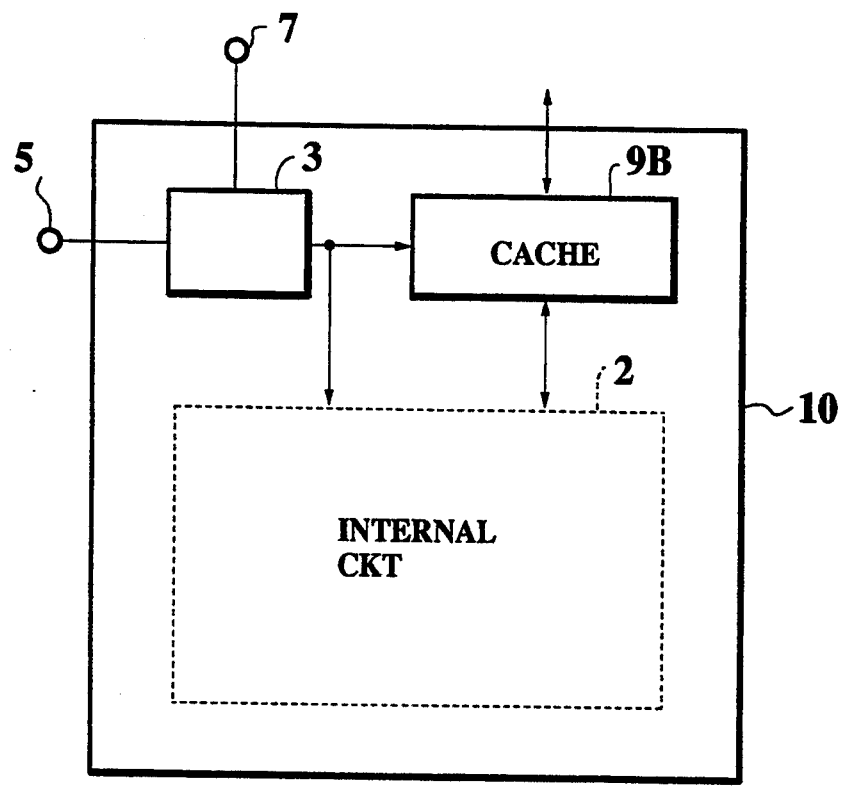
FIG. 4 shows a block diagram of an LSI chip to be tested and evaluated according to the third embodiment, where a built-in on-chip cache memory is implemented therein.

FIG. 4 shows an LSI chip 10 having a cache memory 9B therein, as the third embodiment. Since a main memory is usually connected to an external circuit, it takes time to execute read/write operations. Thus, the cache memory 9B is designed to improve a processing speed of executing commands by storing a part of the commands and operands stored in the main memory, without having to access the main memory, every time. In this third embodiment where the LSI chip 10 has the built-in cache memory 9B, certain commands and operands are set up externally by using the LSI tester/evaluation equipment to initialize the actuation state of the LSI chip 10. Then, the high-speed clock supplied from the clock supply circuit 3 executes a group of commands stored in the cache memory 9B. The group of commands is so set up so that it accesses the cache memory 9B alone. If the commands are also designed to be set up to the external main memory, the LSI chip 10 may access the LSI tester/evaluation equipment at the time of testing. In this case, the LSI tester/evaluation equipment operates at a low speed while the LSI chip 10 operates at a high speed, and thus the LSI chip 10 stops operating.

Figure 5:
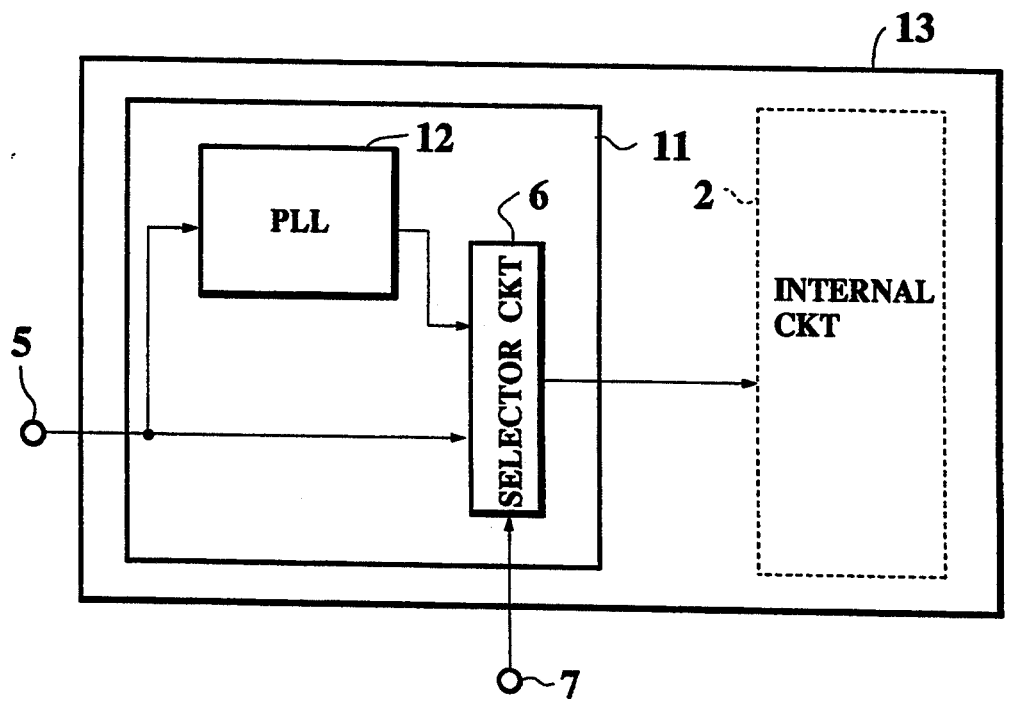
FIG. 5 shows a block diagram of an LSI chip to be tested and evaluated according to the fourth embodiment, where an on-chip clock supply circuit 11 comprising a PLL (Phase Locked Loop) circuit 12 and selector circuit 6 is built in the LSI chip.

FIG. 5 shows the fourth embodiment where a PLL (Phase Locked Loop) circuit 12 is employed in place of the high-speed clock generation circuit 4 in the first embodiment shown in FIG. 2. A clock frequency generated from a clock generation circuit of the PLL circuit is set to a band of the basic operation frequency of an LSI 13 for a general test purpose. The PLL circuit can generate a clock synchronized with an external input clock. Thus, the clock to be generated can be controlled by varying the external clock frequency.

It is to be noted here again that, referring to FIG. 5, a clock supply circuit 11 is built within the LSI chip 13. In a normal case where the testing is not carried out, an external input clock is selected and supplied to the internal circuit 2 so that the LSI 13 is activated.

FIG. 6 shows the fifth embodiment where test pattern means 90 stores certain clock selection signals so that the clock selection signals can be automatically outputted from the selection circuit of a clock supply circuit 30 when the operation mode of the LSI is switched to the test mode. This on-chip, self-testing capability realized in a feedback manner is illustrated with an arrow extending from the test pattern means 90 over a clock supply circuit 30.

It should be noted that a percentage of area occupied by the clock supply circuit and other testing means implemented in the present invention is no more than 1% of the whole LSI, which is negligible in the course of fabrication.

In summary, supplying a relatively low frequency clock is enough in the course of testing and evaluating a high-speed LSI, so that a readily available tester or evaluation means can still be used in testing the high-speed LSI. Furthermore, in the BURN-IN test a high-speed block is generated within the LSI chip, so that a problem of unsteadiness in supplying the clock is eliminated and the testing can be executed precisely, easily and rapidly.

Besides those already mentioned above, many modifications and variations of the above embodiments may be made without departing from the novel and advantageous features of the present invention. Accordingly, all such modifications and variations are intended to be included within the scope of the appended claims.

What is claimed is:

1. An integrated circuit having an internal circuit capable of being tested by a high-speed semiconductor chip tester to test and characterize the internal circuit comprising:
   a clock input terminal connected to the semiconductor chip tester;
   an on-chip clock supply circuit for supplying clock signals;
   a clock selection signal input terminal connected to the on-chip clock supply circuit; and
   the internal circuit connected to the clock supply circuit and receiving the clock signals, said clock selection signal input terminal supplying a test pattern to be applied to the internal circuit; wherein the clock supply circuit includes:
   a clock generation circuit for generating the clock signals; and
   a selection circuit for selecting an appropriate clock signal to be supplied to the internal circuit, the selection circuit being connected to the clock generation circuit, the clock input terminal, and the clock selection signal input terminal.

2. The integrated circuit according to claim 1, wherein the clock generation circuit includes means for generating high-speed clock signals having speeds of greater than 50 MHz.

3. The integrated circuit according to claim 1, further comprising a memory for receiving the clock signals from the clock supply circuit and outputting date to the internal circuit in response to the clock signals.

4. The integrated circuit according to claim 3, wherein the memory is a test pattern memory including means for outputting test patterns to the internal circuit synchronously with the clock signals supplied from the clock supply circuit.

5. The integrated circuit according to claim 3, wherein the memory is a cache memory including means for outputting a stored command to the internal circuit in response to an output of the clock supply circuit.

6. The integrated circuit according to claim 4, wherein the test pattern memory stores predetermined clock selection signals and automatically outputs, in a feedback manner, the clock selection signals from the selection circuit.

7. The integrated circuit according to claim 4, wherein the test pattern memory includes one of a read only memory (ROM), a programmable ROM, an erasable programmable ROM, and an electrically erasable programmable ROM.

8. The integrated circuit according to claim 1, wherein the clock generation circuit includes a phase-locked loop circuit, said generated clock signals from the phase-locked loop circuit being synchronous with the semiconductor tester.

9. The integrated circuit according to claim 8, further comprising a memory for receiving the clock signals from the clock supply circuit and outputting data to the internal circuit in response to the clock signals.

10. The integrated circuit according to claim 9, wherein the memory includes a test pattern memory including means for outputting test patterns to the internal circuit synchronously with the clock signals supplied from the phase-locked loop circuit through the selection circuit.

11. The integrated circuit according to claim 9, wherein the memory includes a cache memory including means for outputting stored commands to the internal circuit in response to an output of the phase-locked loop circuit through the selection circuit.

12. The integrated circuit according to claim 10, wherein the test pattern memory stores predetermined clock selection signals and automatically outputs, in a feedback manner, the clock selection signals from the selection circuit.

13. The integrated circuit according to claim 10, wherein the test pattern memory includes one of a read only memory (ROM), a programmable ROM, an erasable programmable ROM, and an electrically erasable programmable ROM.

* * * * *

UNITED STATES PATENT AND TRADEMARK OFFICE
CERTIFICATE OF CORRECTION

PATENT NO. : 5,381,087
DATED : January 10, 1995
INVENTOR(S) : Masashi HIRANO

It is certified that error appears in the above-indentified patent and that said Letters Patent is hereby corrected as shown below:

Claim 3, Column 5, Line 50 change "date" to --data--.

Signed and Sealed this

Sixth Day of June, 1995

BRUCE LEHMAN

Attest:

Attesting Officer

Commissioner of Patents and Trademarks